United States Patent [19]

Kamasaki

[11] Patent Number: 4,712,017
[45] Date of Patent: Dec. 8, 1987

[54] PHOTOCOUPLER DEVICE HAVING REFLECTING SURFACE ENHANCE SIGNAL TRANSMISSION

[75] Inventor: Keiji Kamasaki, Yokohama, Japan

[73] Assignee: Kabushiki Kaisha Toshiba, Kawasaki, Japan

[21] Appl. No.: 749,382

[22] Filed: Jun. 27, 1985

[30] Foreign Application Priority Data

Oct. 16, 1984 [JP] Japan .................. 59-217103

[51] Int. Cl.⁴ ............................................. G02B 27/00
[52] U.S. Cl. ....................................... 250/551; 357/19
[58] Field of Search ............... 250/551; 357/19; 455/602; 307/311

[56] References Cited

U.S. PATENT DOCUMENTS

| | | | |
|---|---|---|---|
| 3,859,536 | 1/1975 | Thiel | 250/551 |
| 4,110,781 | 8/1978 | Konishi et al. | 357/19 |
| 4,114,177 | 9/1978 | King | 250/551 |
| 4,124,860 | 11/1978 | Johnson | 357/19 |
| 4,179,619 | 12/1979 | Cook | 250/551 |
| 4,268,756 | 5/1981 | Crouse et al. | 250/551 |
| 4,412,135 | 10/1983 | Awaji | 250/551 |

OTHER PUBLICATIONS

IEEE Journal of Solid-State Circuits, vol. SC-14, No. 6, Dec. 1979, pp. 995-1003, New York, U.S.; H. Mori et al.: "An Optically-Coupled High-Voltage p-n-p-n Crosspoint Array".

Abstract for Japanese Pat. No. 57-79678(A) issued 5/18/82.

Japanese Journal of Applied Physics, vol. 18, Supplement 18-1, 1979, pp. 405-410, Tokyo, JP; Y. Sugawara et al.: "Integrated Photo-Coupled Semiconductor Crosspoint Switches".

Electron Device Letters, vol. EDL-1, No. 2, Feb. 1980, pp. 15-17, New York, U.S.; R. J. Roedel et al.: "A Ga1-xAlxAs Monolithic Opto-Isolator".

Primary Examiner—David C. Nelms
Assistant Examiner—William L. Oen
Attorney, Agent, or Firm—Finnegan, Henderson, Farabow, Garrett & Dunner

[57] ABSTRACT

A photocoupler device which comprises a light-emitting element and a light-receiving element which comprises a 4-layer structure of the PNPN conductivity type, and wherein that portion of said light-receiving element where a light entered does not contribute to its operation is covered with a light-reflecting membrane.

7 Claims, 8 Drawing Figures

PHOTOCOUPLER DEVICE HAVING REFLECTING SURFACE ENHANCE SIGNAL TRANSMISSION

BACKGROUND OF THE INVENTION

This invention relates to a photocoupler device which comprises a light-emitting element and a light-receiving element which converts a light, issued from said light-emitting element, into an electric signal.

Reference is now made to the conventional photothyristor coupler whose cross section is indicated in FIG. 1. The photocoupler comprises a light-emitting element 2 mounted on a lead frame $1_1$ and a photothyristor element 3 provided on a lead frame $1_2$. The elements 2 and 3 are facing each other. The coupler also comprises a light-permeable silicone resin layer 4, in a space defined between said two elements, to be used as a photocoupling route. The whole mass is molded by a layer 5 of epoxy resin. With the above-mentioned conventional photothyristor coupler, the object of ensuring the efficient photocoupling of a light issued from the light-emitting element 2 to a photothyristor element 3 is sometimes attained by mixing the epoxy resin with a suitable material to elevate its photoreflectivity, or, by applying a material of high photoreflectivity to an interface between the light-permeable silicone resin layer 4 and epoxy resin layer 5.

FIGS. 2 and 3 jointly represent a photothyristor element used with the conventional photothyristor coupler. FIG. 2 shows the cross section of said photothyristor. FIG. 3 is the pattern of an assembly of an electrode and semiconductor region as viewed from the major surface of said conventional photothyristor coupler. The photothyristor element of FIG. 3 comprises a semiconductor substrate comprising an N conductivity type base region 6, a P+ conductivity type anode region 7 and P conductivity type base region 8 both mounted on the major surface of said N conductivity type base region 6, and an N+ conductivity type cathode region 10 formed in said P conductivity type base region 8. A cathode electrode 11 is formed on the N+ type cathode region 10. A gate electrode 12 is mounted on the P conductivity type base region 8. An anode electrode 13 is deposited on the P+ conductivity type anode region 7. Referring to FIG. 2, reference numeral 9 denotes a P conductivity type isolation region. Reference numeral 14 represents a passivation film prepared from, for example, an oxide film. The thyristor element is fabricated by the planar element-forming process.

While impressed with a bias voltage in the forward direction, the conventional thyristor element is rendered conducting upon receipt of a light. In this case, it is to be noted that all beams of light entering the thyristor element do not render the thyristor conducting. Namely, only the light entering the hatched region 15 of FIG. 3 (observation is directed toward the major surface of the thyristor) acts effectively. The hatched region comprises the whole N+ conductivity type cathode region 10, the whole P conductivity type base region 8 and that portion of the N conductivity type base region 6 which is defined by the PN junction J1 between the N conductivity type base region 6 and P conductivity type base region 8 and the carrier diffusion length L in the N conductivity type base region 6. The hatched region will be referred to as "an effective light-receiving region".) The light which is impinged on the other regions, particularly the isolation region 6, takes essentially no part in rendering the thyristor element conducting.

SUMMARY OF THE INVENTION

This invention has been accomplished in view of the above-mentioned circumstances and is intended to provide a photocoupler device comprising a light-receiving element, such as a photothyristor, which enables a light to enter the effective light-receiving region at a higher rate, than was previously the case, thereby elevating the switching property of the light-receiving element.

According to the invention there is provided a photocoupler device which comprises a light-emitting element, and a semiconductor light-receiving element capable of converting a light issued from said light-emitting element into an electric signal, a light-reflecting layer being provided on an ineffective region of said light-receiving element where a light entered does not contribute to the operation of said light-receiving element.

DETAILED DESCRIPTION OF THE PREFERRED EMBODIMENTS

Figure 1:
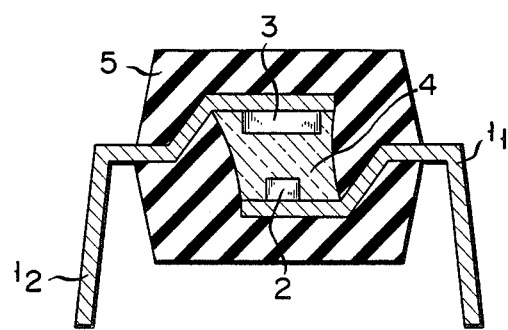
FIG. 1 is a cross sectional view of the conventional photocoupler device.
Figure 2:
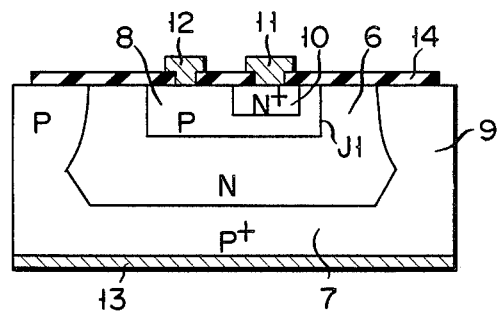
FIG. 2 is a sectional view of a photothyristor, acting as a light-receiving element, which is assembled with the photocoupling element involved in the photocoupler device of FIG. 1.
Figure 3:
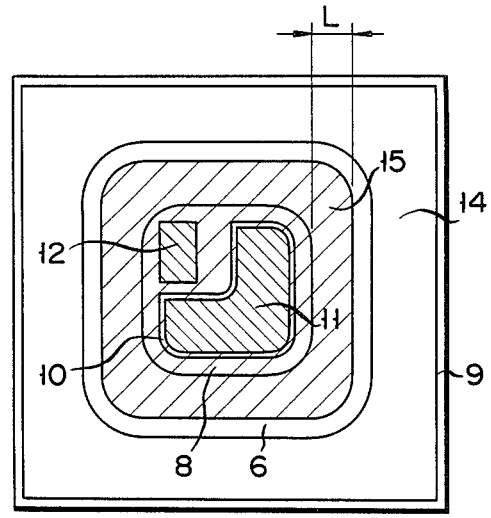
FIG. 3 is a plan view of the thyristor electrode and semiconductor region shown in FIG. 2.
Figure 4:
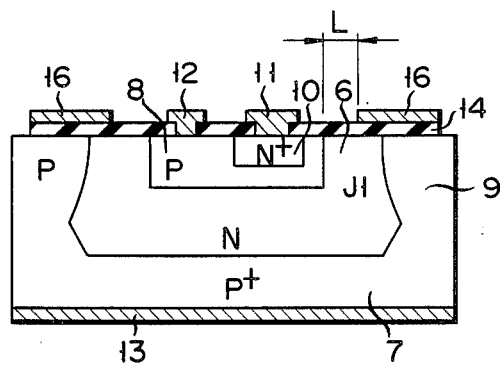
FIG. 4 is a sectional view of a photothyristor, acting as a light-receiving element, assembled with a photocoupler device embodying this invention.

FIG. 4 is a cross-sectional view of a photothyristor, acting as a light-receiving element, which is assembled with a photocoupler device embodying this invention. Since the photothyristor of FIG. 4 is shown as an equivalent for the conventional type of FIG. 2, the parts of the photothyristor of FIG. 4, the same as those of said conventional type, are denoted by the same numerals.

Referring to FIG. 4, the N conductivity type region 6 constitutes a first base region. Mounted on the major surface of said N conductivity type base region 6 are a P+ conductivity type region 7 acting as an anode region and a P conductivity type base region 8 acting as a second base region. Formed in said P conductivity type base region 8 is an N+ conductivity type region 10 acting as a cathode region. Said N conductivity type base region 6 is enclosed in an isolation region 9 of P conductivity type. Since the semiconductor substrate constructed, as described above, is of a planar type, the PN junctions are exposed on the major surface of said semiconductor substrate. A cathode electrode 11 is formed on the N+ conductivity type cathode region 10. A gate electrode 12 is mounted on the P conductivity type base region 8. An anode electrode 13 is deposited on the P+ conductivity type anode region 7. A passivation film 14 prepared from, for example, $SiO_2$, is mounted on those portions of the major surface of the semiconductor substrate on which the aforesaid PN junctions are exposed (except for that region of said major surface on which the electrode is deposited). A light-reflecting membrane 16, prepared from aluminum, is formed on a region facing that region of the semiconductor substrate (an ineffective light-receiving region) which is incapable of causing the received light to render the thyristor element conducting in order to reflect said received light on said ineffective light-receiving region. Those regions of the semiconductor substrate which cause the received light to effectively function for the aforementioned switching operation are constituted by the whole N+ conductivity type cathode region 10, the whole P conductivity type base region 8 and that portion of the N conductivity type base region 6 which is defined by the PN junction J1 between the N conductivity type base region 6 and P conductivity type base region 8 and the carrier diffusion length in the N conductivity type base region 6. As clearly seen from FIG. 5, the aluminum layer 11 is formed on the ineffective light-receiving region (a region lying outside of the above-mentioned area L of the carrier diffusion), i.e., other region than the aforesaid effective light-receiving region.

Figure 5:
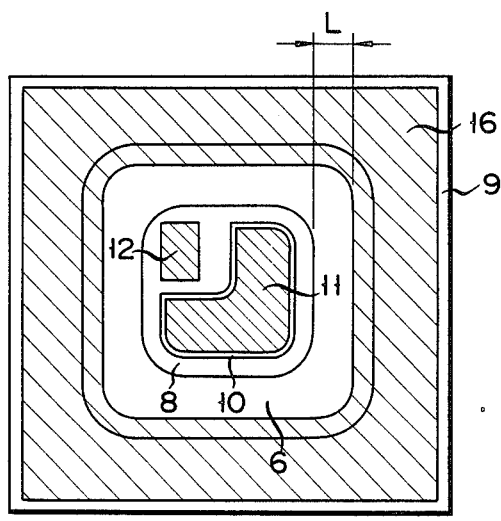
FIG. 5 is a plan view of the thyristor element shown in FIG. 4.

The photothyristor constructed as shown in FIGS. 4 and 5 is fabricated through the following steps. First, an N conductivity type silicon semiconductor substrate is provided. An isolation P conductivity type region 9 is formed by the selective diffusion of boron to surround an N conductivity type base region 6. Boron is implanted from both major surfaces of said N conductivity type silicon semiconductor substrate, and thereafter the whole mass is subjected to heat treatment. As a result, the P+ conductivity type anode region 7 and P conductivity type base region 8 are formed on both major surfaces of the N conductivity type base region 6. Phosphor is selectively implanted in the P conductivity type base region 8. The whole mass is again subjected to heat treatment, thereby providing the N+ conductivity type cathode region 10. Thereafter, an $SiO_2$ membrane acting as a passivation film 14 is formed by thermal oxidation on that portion of the major surface of the semiconductor body on which the aforesaid PN junction J1 is exposed. Then electrode contact holes are formed in said passivation film 14 with a sufficient depth to expose the cathode region 10 and P conductivity type region 8. Thereafter, a metal layer of aluminum is thermally deposited on the passivation film 14 and on the underside of the P+ conductivity type anode region 7. The thermally deposited metal layer is subjected to the known patterning process to retain the cathode electrode 11, gate electrode 12, light-reflecting membrane 16 and anode electrode 13. Thus is formed the thyristor element shown in FIG. 4.

Figure 6:
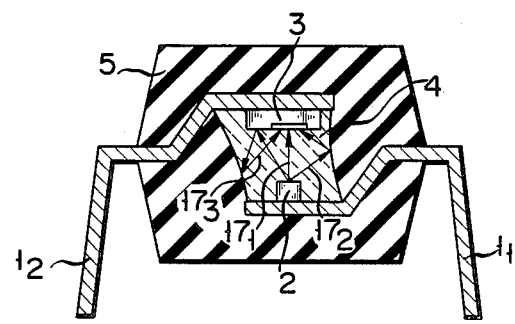
FIG. 6 is a sectional view of the photocoupler device of the invention fitted with the thyristor element of FIG. 4.

FIG. 6 is a sectional view of a photocoupler element which comprises the thyristor constructed as shown in FIG. 4 to act as a light-receiving element. As seen from FIG. 6, a light-emitting element 2, mounted on a metal lead frame $1_1$, and prepared from aluminum, and the photothyristor 3, constructed as shown in FIG. 4 and mounted on the lead frame $1_2$, having the same construction as the lead frame $1_1$, are so arranged as to face each other. Light-permeable silicone resin 4 is filled in a space defined between both elements 2, 3. This silicone resin 4 acts as a photocoupling route. The lead frames $1_1$ and $1_2$ and silicone resin 4 are molded in epoxy resin 5. As shown in FIG. 6, a light issued from the light-emitting element 2 is directly carried into the effective light-receiving region of the thyristor 3. Those portions of the light which are not directly brought into said effective light-receiving region enter it through various routes. That portion $17_2$ of the incoming light which is not directly carried into said effective light-receiving region is reflected from the surface of the molding resin layer 5, and then taken into said effective light-receiving region. The other portion $17_3$ of the incoming light which is not directly taken into said effective light-receiving region reflects from the surface of a metal layer 16, then enters the molding resin layer 5, reflects from the surface of said molding resin layer 5 and finally enters said effective light-receiving region. If the above-mentioned metal layer 16 is not provided, the aforementioned light portion $17_3$ will make no reflection and be turned into a wasteful component making no contribution to the operation of the subject photocoupler device. The metal layer 16 offers the advantages that a light entering the region where said metal layer 16 is provided is reflected and finally enters the effective light-receiving region; and consequently a light can enter the thyristor element acting as a light-receiving element at an increased rate, thereby elevating the switching property of said thyristor element. Comparison was made between the switching sensitivity of the thyristor element assembled with the photocoupler device of this invention, which was constructed as shown in FIG. 4 by covering the isolation region 9 with a metal layer 16 (that is, by covering 50% of the major surface of the semiconductor body), and the conventional photocoupler element in which the metal layer 16 was not provided. The comparison proved that the photocoupler device of this invention enabled the switching rate of the thyristor element to be improved about 25% over that of the thyristor element involved in the conventional photocoupler device. Throughout the above-mentioned comparative experiments, the molding resin 5 used with the conventional photocoupler element and that of the present invention was prepared from epoxy resin to which 5% by weight of titanium oxide ($TiO_2$) was added in order to render said molding resin 5 white, thereby to elevate the light reflectivity.

Figure 7:
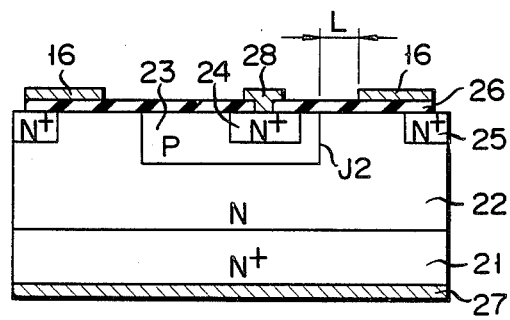
FIGS. 7 and 8 are the sectional views of the different light-receiving elements assembled with the photocoupler device of this invention.

FIG. 7 shows a modification of a light-receiving element assembled with the photocoupler device of this invention. This modification represents a phototransistor. An N+ conductivity type region 21 and N conductivity type region 22 jointly constitute a collector region. A P conductivity type region 23 formed in said N conductivity type region 22 constitutes a base region. An N+ conductivity type 24 formed in said P conductivity type region 23 constitutes an emitter region. An emitter electrode 28 is mounted on the emitter region 24. A collector electrode 27 is deposited on the N+ conductivity type collector region 21. A channel-cutting N+ conductivity type region 25 is provided in the N conductivity type collector region 22. An oxide layer 26 is formed on the major surface of the semiconductor substrate constructed as described above, except for that portion of said major surface on which an emitter electrode 28 is formed. In the modification of FIG. 7, too, a light-reflecting metal layer 16 is deposited on an oxide layer 26 facing the ineffective light-receiving region of the semiconductor substrate. With the light-receiving element, that is, the phototransistor constructed as described above, the effective light-receiving region is constituted by the whole emitter region 24, the whole base region 23 and that portion of the N conductivity type collector region which is defined by the PN junction J2 between the P conductivity type base region 23 and N conductivity type collector region and the carrier diffusion length L in the N conductivity type collector region. The other region represents an ineffective light-receiving region.

Figure 8:
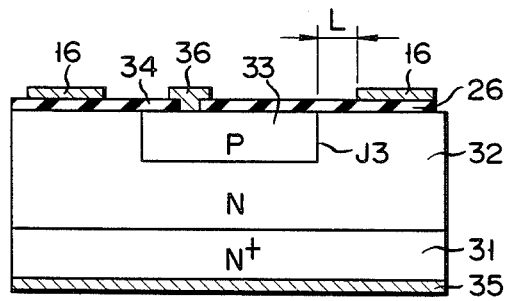

A description may now be made of another modification of FIG. 8. This modification represents a photodiode. An N conductivity type region 32 and N+ conductivity type region 31 jointly constitute a cathode region. A P conductivity type region 33, formed in said N conductivity type region 32, constitutes an anode region. An anode electrode 36 is deposited on the anode region 33. A cathode electrode 35 is mounted on the N+ conductivity type cathode region 31. An oxide layer 34 is formed on the major surface of the semiconductor substrate, constructed as described above, on which the anode electrode 36 is deposited, except for that portion of said major surface on which said anode electrode 36 is mounted. Also, in the above instance, a light-reflecting metal layer 16 is deposited on that portion of the oxide layer 26 which faces the ineffective light-receiving region of the semiconductor substrate. In the above-mentioned modification, the effective light-receiving region is constituted by the whole P conductivity type anode region 33 and that portion of the N conductivity type cathode region 32 which is defined by the PN junction J3 between the N conductivity type cathode region 32 and P conductivity type anode region 33 and the carrier diffusion length L in the N conductivity type cathode region 32. The other regions are ineffective light-receiving areas. Referring to those regions which are regarded as effective light-receiving regions in the foregoing description of the light-receiving elements, the electrode regions are, needless to say, ineffective light-receiving regions. The light-reflecting metal layer 16 proves considerably effective with respect to the light-receiving elements, even though provided only on part of the ineffective light-receiving region, instead of on its whole area. Still, said light-reflecting metal layer 16 may, if necessary, be formed on part of the above-mentioned effective light-receiving region. In this case, however, an appreciable reduction necessarily takes place in the effective light-receiving rate.

The light-receiving element assembled with the photocoupler device of this invention is not limited to the aforementioned type, but may be fabricated with different modifications without departing from the scope and object of the invention. The foregoing example represents a photocoupler element wherein the light-emitting element and light-receiving element are made to face each other. However, this invention is not limited to such an example, but may be that type of photocoupler wherein the light-emitting plane of said light-emitting element and the light-receiving plane of said light-receiving element may be horizontally arranged so as to be made flush with each other.

As mentioned above, the photocoupler device of this invention offers the advantages that a light-reflecting layer is deposited on the ineffective light-receiving region of the light-receiving element. Therefore, a light entering the aforesaid ineffective light-receiving region, which would be simply wasted in case of the absence of the above-described light-reflecting metal layer, can effectively act thereby to elevate the sensitivity of the subject photocoupling element.

What is claimed is:

1. A photocoupler device, comprising:
   a light-emitting element for emitting light;
   a semiconductor light-receiving element having a light-receiving planar surface region for receiving light emitted from said light-emitting element, said light-receiving planar surface region having an effective portion and an ineffective portion, said effective portion converting light impinging thereon into an electricla signal; and
   a light-reflecting layer formed on said ineffective portion of said light-receiving planar surface region for reflecting at least a portion of said light emitted from said light-emitting element onto said effective portion of said light-receiving planar surface region, thereby making an effective use of said reflected light to generate said electric signal.

2. The photocoupler device according to claim 1, wherein said semiconductor light-receiving element is a photothyristor, said photothyristor including:
   an anode region of a first conductivity type;
   an emitter region;
   a first base region of a second conductivity type formed on said emitter region;
   a second base region formed on said first base region and having said first conductivity type;
   a cathode region formed in said second base region and having said second conductivity type; and
   an isolation laying having said first conductivity type and surrounding said first base region.

3. The photocoupler device according to claim 1, wherein said semiconductor light-receiving element is a phototransistor element, said phototransistor element including:
   a collector region of a first conductivity type;
   a base region formed in said collector region and having a second conductivity type; and
   an emitter region formed in said base region and having said first conductivity type.

4. The photocoupler device according to claim 1, wherein said semiconductor light-receiving element is a photodiode element, said photodiode element including:
   a cathode region of a first conductivity type; and
   an anode region formed on said cathode region and having a second conductivity type.

5. The photocoupler device according to claim 2, wherein said first base region and said second base region define a PN junction therebetween and said ineffective portion comprises that portion of said first base region which is outside a portion defined by said PN junction and the carrier diffusion length in said first base region.

6. The photocoupler device according to claim 3, wherein said collector region and said base region define a PN junction therebetween and said ineffective portion comprises that portion of said collector region which is outside a portion defined by said PN junction and the carrier diffusion length in said collector region.

7. The photocoupler device according to claim 4, wherein said cathode region and said anode region define a PN junction therebetween and said ineffective portion comprises that portion of said cathode region which is outside a portion defined by said PN junction and the carrier diffusion length in said cathode region.

* * * * *